(12) United States Patent
Woo et al.

(10) Patent No.: US 11,041,089 B2
(45) Date of Patent: Jun. 22, 2021

(54) ENCAPSULATING COMPOSITION

(71) Applicant: LG CHEM, LTD., Seoul (KR)

(72) Inventors: Yu Jin Woo, Daejeon (KR); Joon Hyung Kim, Daejeon (KR); Kook Hyun Choi, Daejeon (KR); Mi Lim Yu, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 16/467,402

(22) PCT Filed: Dec. 11, 2017

(86) PCT No.: PCT/KR2017/014481
§ 371 (c)(1),
(2) Date: Jun. 6, 2019

(87) PCT Pub. No.: WO2018/106089
PCT Pub. Date: Jun. 14, 2018

(65) Prior Publication Data
US 2020/0095454 A1     Mar. 26, 2020

(30) Foreign Application Priority Data

Dec. 9, 2016  (KR) .................. 10-2016-0167800

(51) Int. Cl.
| | |
|---|---|
| *C09D 163/00* | (2006.01) |
| *C08L 63/00* | (2006.01) |
| *H01L 51/52* | (2006.01) |
| *H01L 51/00* | (2006.01) |
| *C09D 11/30* | (2014.01) |
| *C09D 11/102* | (2014.01) |
| *C09D 11/101* | (2014.01) |

(52) U.S. Cl.
CPC ............ *C09D 163/00* (2013.01); *C08L 63/00* (2013.01); *C09D 11/101* (2013.01); *C09D 11/102* (2013.01); *C09D 11/30* (2013.01); *H01L 51/0035* (2013.01); *H01L 51/5253* (2013.01)

(58) Field of Classification Search
None
See application file for complete search history.

(56) References Cited

U.S. PATENT DOCUMENTS

| | | | | |
|---|---|---|---|---|
| 2015/0131038 A1* | 5/2015 | Ishiguro | ............ | G02F 1/133528 349/96 |
| 2015/0210905 A1* | 7/2015 | Hoshino | ................ | C08G 59/24 438/26 |

FOREIGN PATENT DOCUMENTS

| | | | |
|---|---|---|---|
| JP | 2004-339341 | A | 12/2004 |
| JP | 2009-263677 | A | 11/2009 |
| JP | 4780275 | B2 | 9/2011 |
| JP | 2016-094606 | A | 5/2016 |
| KR | 10-2010-0061381 | A | 6/2010 |

(Continued)

*Primary Examiner* — Robert K Carpenter
(74) *Attorney, Agent, or Firm* — Dentons US LLP

(57) ABSTRACT

The present application relates to an encapsulating composition, a method for preparing the same and an organic electronic device comprising the same, and provides an encapsulating composition which can effectively block moisture or oxygen introduced into an organic electronic device from the outside to secure the lifetime of the organic electronic device, is possible to realize a top emission type organic electronic device, is applicable to an inkjet method, can provide a thin display and can control moisture content to prevent damage to the element.

19 Claims, 1 Drawing Sheet

(56) References Cited

FOREIGN PATENT DOCUMENTS

| | | |
|---|---|---|
| KR | 10-2010-0118870 A | 11/2010 |
| KR | 10-2014-0104023 A | 8/2014 |
| KR | 10-2014-0107815 A | 9/2014 |
| KR | 10-2014-0115883 A | 10/2014 |
| KR | 10-2015-0033581 A | 4/2015 |
| KR | 10-2015-0039757 A | 4/2015 |
| KR | 10-2016-0111377 A | 9/2016 |
| TW | 201410720 A | 3/2014 |
| WO | 2013/179874 A1 | 12/2013 |
| WO | 2014017524 A1 | 1/2014 |

* cited by examiner

[Figure 1]
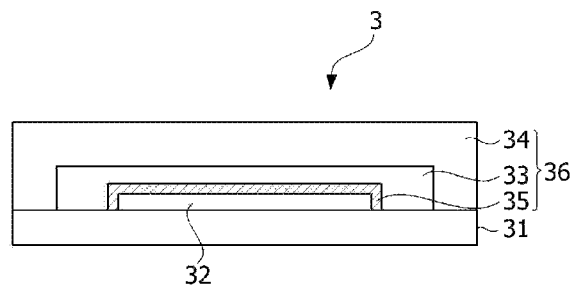
[Figure 2]
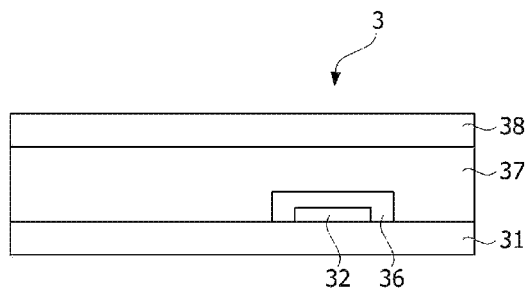

ary of priority based filed on Dec. 9, 2016, the disclosure of which is incorporated herein by reference in its entirety.

ENCAPSULATING COMPOSITION

CROSS-REFERENCE TO RELATED APPLICATIONS

This application is a U.S. National Phase Application of International Application No. PCT/KR2017/014481, filed on Dec. 11, 2017, which claims the benefit of priority based on Korean Patent Application No. 10-2016-0167800 filed on Dec. 9, 2016, the disclosure of which is incorporated herein by reference in its entirety.

TECHNICAL FIELD

The present application relates to an encapsulating composition, a method for preparing the same, an organic electronic device comprising the same, and a method for manufacturing the organic electronic device.

BACKGROUND ART

An organic electronic device (OED) means a device comprising a layer of an organic material that generates an alternating current of electric charges using holes and electrons, and an example thereof may include a photovoltaic device, a rectifier, a transmitter and an organic light emitting diode (OLED), and the like.

The organic light emitting diode (OLED) among the organic electronic devices has lower power consumption and faster response speed, than conventional light sources, and is advantageous for thinning display devices or illuminations. In addition, the OLED has excellent space utilization, so that it is expected to be applied in various fields covering various portable devices, monitors, notebooks, and televisions.

In commercialization and application expansion of OLEDs, the most important problem is a durability problem. Organic materials and metal electrodes, and the like, contained in OLEDs are very easily oxidized by external factors such as moisture. Thus, products comprising OLEDs are highly sensitive to environmental factors. Accordingly, various methods have been proposed to effectively block penetration of oxygen or moisture from the outside into organic electronic devices such as OLEDs.

DISCLOSURE

Technical Problem

The present application provides an encapsulating composition which can effectively block moisture or oxygen introduced into an organic electronic device from the outside to secure the lifetime of the organic electronic device, is possible to realize a top emission type organic electronic device and is applicable to an inkjet method, and a method for preparing the same and an organic electronic device comprising the same.

Technical Solution

The present application relates to an encapsulating composition. The encapsulating composition may be a sealing material applied to sealing or encapsulating an organic electronic device such as, for example, an OLED. In one example, the encapsulating composition of the present application can be applied to sealing or encapsulating the entire surface of an organic electronic element. Thus, after the encapsulating composition is applied to the encapsulation, it may be present in an organic layer form sealing the entire surface of the organic electronic element. In addition, the organic layer may be laminated on the organic electronic element together with a protective layer and/or an inorganic layer, which is described below, to form a sealing structure.

In an embodiment of the present application, the present application relates to an encapsulating composition for sealing an organic electronic element which is applicable to an inkjet process, wherein the composition may be designed to have appropriate physical properties when it has been discharged onto a substrate using inkjet printing capable of non-contact patterning.

In this specification, the term "organic electronic device" means an article or device having a structure comprising an organic material layer that generates an alternating current of electric charges using holes and electrons between a pair of electrodes facing each other, and an example thereof may include a photovoltaic device, a rectifier, a transmitter and an organic light emitting diode (OLED), and the like, but is not limited thereto. In one example of the present application, the organic electronic device may be an OLED.

An exemplary encapsulating composition may comprise an epoxy compound. The encapsulating composition may be in a solventless form. The solventless form may mean a composition in a form in which no organic solvent is included. The encapsulating composition may have a moisture content of 1000 ppm or less, 600 ppm or less, 500 ppm or less, or 100 ppm or less, in accordance with a Karl Fischer coulometric titration method for 100 mg of the composition. The lower limit is not particularly limited and may be 0 ppm or 10 ppm. The moisture measurement can be performed at a temperature of 25° C., proceed in an airtight container and adjusted to an equivalent point of 50 mV within an appropriate speed range of 0.3 to 2240 μg/min. Here, in the coulometric method, iodine is generated electrically from a generating electrode to react with water. At this time, the moisture content in the sample is calculated from the number of moles of electrons used to generate iodine. The measurement can be measured using Karl fischer titrators-831 KF Coulometer-coulometric from Metrohm. By controlling the moisture content of the encapsulating composition before curing as above, the present application can prevent chemical damage from being applied to the element even if it is directly applied to the organic electronic element and suppress generation and growth of dark spots in the organic electronic device.

In one example, the encapsulating composition of the present application may have an amount of volatile organic compounds measured after curing of less than 100 ppm. The lower limit is not particularly limited, which may be 0 ppm or 10 ppm. In this specification, the volatile organic compound can be represented as outgas. The volatile organic compounds may be measured after curing the encapsulating composition and then holding a sample of the cured product at 110° C. for 30 minutes using Purge & Trap-gas chromatography/mass spectrometry. The measurement may be performed using a Purge & Trap sampler (JAI JTD-505 III)-GC/MS (Agilent 7890b/5977a) instrument. by controlling the amount of generation of the volatile organic compounds in the encapsulating composition as above, the present application can prevent the chemical damage from being applied to the element even if it is directly applied to the organic electronic element.

In an embodiment of the present application, the encapsulating composition may comprise a compound having an oxetane group in a range of 45 to 145 parts by weight relative to 100 parts by weight of the epoxy compound. The epoxy compound may be a photo-curable or thermosetting compound, and in an embodiment of the present application, it may be a photo-curable compound. The compound having an oxetane group may be comprised in an amount of 45 to 145 parts by weight, 48 to 144 parts by weight, 63 to 143 parts by weight or 68 to 142 parts by weight, relative to 100 parts by weight of the epoxy compound. In this specification, the term "part by weight" may mean a weight ratio between the respective components. By controlling the content ratio of the composition, the present application can form an organic layer on an organic electronic element by an ink jet method, and the applied encapsulating composition can provide an organic layer having excellent spreadability in a short time and excellent curing sensitivity after curing. In one example, the encapsulating composition of the present application may have a contact angle to glass of 30° or less, 25° or less, 20° or less, or 12° or less. The lower limit is not particularly limited, but may be 10 or 3° or more. By adjusting the contact angle to 30° or less, the present application can ensure spreadability in a short time in the inkjet coating, thereby forming an organic layer of a thin film. In the present application, the contact angle may be measured by applying a drop of the encapsulating composition onto glass using a sessile drop measurement method, which may be an average value measured after applying 5 times.

In one example, the epoxy compound may have at least bifunctionality or more. That is, one or more, or two or more epoxy functional groups may be present in the compound, and the upper limit is not particularly limited, but may be 10 or less. The epoxy compound realizes excellent heat resistance durability at high temperature and high humidity by realizing an appropriate cross-linking degree in an adhesive.

In an embodiment of the present application, the epoxy compound may comprise a compound having a cyclic structure in its molecular structure and/or a linear or branched aliphatic compound. That is, the encapsulating composition of the present application may comprise at least one of a compound having a cyclic structure in its molecular structure and a linear or branched aliphatic compound as the epoxy compound, and may also comprise them together. In one example, the compound having a cyclic structure in the molecular structure may have ring constituent atoms in the molecular structure in a range of 3 to 10, 4 to 8, or 5 to 7, and one or more, or two or more, or 10 or less of the cyclic structures may be present in the compound. When the compound having a cyclic structure and the linear or branched aliphatic compound are included together, the linear or branched aliphatic compound may be comprised in a range of 20 parts by weight or more, less than 205 parts by weight, 23 parts by weight to 204 parts by weight, 30 parts by weight to 203 parts by weight, 34 parts by weight to 202 parts by weight, 40 parts by weight to 201 parts by weight, 60 parts by weight to 200 parts by weight or 100 parts by weight to 173 parts by weight, relative to 100 parts by weight of the compound having a cyclic structure. By controlling the content range, the present application makes it possible to prevent element damage in top sealing the organic electronic element, to have appropriate physical properties that can be ink-jetted, to have excellent curing strength after curing, and also to realize excellent moisture barrier properties together.

In one example, the epoxy compound may have an epoxy equivalent in a range of 50 to 350 g/eq, 73 to 332 g/eq, 94 to 318 g/eq or 123 to 298 g/eq. In addition, the compound having an oxetane group may have a weight average molecular weight in a range of 150 to 1,000 g/mol, 173 to 980 g/mol, 188 to 860 g/mol, 210 to 823 g/mol or 330 to 780 g/mol. By controlling the epoxy equivalent of the epoxy compound to be low or controlling the weight average molecular weight of the compound having an oxetane group to be low, the present application can prevent the viscosity of the composition from becoming excessively high to render the inkjet process impossible, while improving the curing completion degree after curing of the sealing material, and simultaneously provide moisture barrier properties and excellent curing sensitivity. In this specification, the weight average molecular weight means a value converted to standard polystyrene measured by GPC (gel permeation chromatograph). In one example, a column made of a metal tube having a length of 250 to 300 mm and an inner diameter of 4.5 to 7.5 mm is filled with 3 to 20 mm polystyrene beads. When a solution diluted by dissolving a substance to be measured in a THF solvent is passed through the column, the weight average molecular weight can be indirectly measured according to a flowing time. It can be detected by plotting amounts separated from the column by size for each time. Also, the epoxy equivalent herein is grams (g/eq) of a resin containing one gram equivalent of epoxy group, which can be measured according to the method defined in JIS K 7236.

Also, the compound having an oxetane group may have a boiling point in a range of 90 to 300° C., 98 to 270° C., 110 to 258° C., or 138 to 237° C. By controlling the boiling point of the compound to the above range, the present application can provide a sealing material which can have excellent moisture barrier properties from the outside while realizing excellent printability even at a high temperature in an inkjet process, and prevent damage applied to the element due to suppressed outgas. In this specification, the boiling point may be measured at 1 atm, unless otherwise specified.

In one example, the compound having a cyclic structure in its molecular structure may be exemplified by 3,4-epoxycyclohexylmethyl 3',4'-epoxycyclohexanecarboxylate (EEC) and derivatives, dicyclopentadiene dioxide and derivatives, vinylcyclohexene dioxide and derivatives, or 1,4-cyclohexanedimethanol bis(3,4-epoxycyclohexanecarboxylate) and derivatives, but is not limited thereto.

In one example, the structure of the compound comprising the oxetane group is not limited as long as it has the functional group, and for example, OXT-221, CHOX, OX-SC, OXT101, OXT121 or OXT212 from TOAGOSEI, or EHO, OXBP, OXTP or OXMA from ETERNACOLL may be exemplified. Also, the linear or branched aliphatic epoxy compound may include aliphatic glycidyl ether, 1,4-butanediol diglycidyl ether, ethylene glycol diglycidyl ether, 1,6-hexanediol diglycidyl ether, propylene glycol diglycidyl ether, diethylene glycol diglycidyl ether, butyl glycidyl ether, 2-ethylhexyl glycidyl ether or neopentyl glycol diglycidyl ether, but is not limited thereto.

In an embodiment of the present application, the encapsulating composition may further comprise a surfactant. In one example, the surfactant may comprise a polar functional group, where the polar functional group may be present at the compound structural end of the surfactant. The polar functional group may include, for example, a carboxyl group, a hydroxyl group, a phosphate, an ammonium salt, a carboxylate group, a sulfate or a sulfonate. Furthermore, in an embodiment of the present application, the surfactant may be a non-silicone-based surfactant or a fluorine-based surfactant. The non-silicone-based surfactant or the fluorine-based surfactant may be applied together with the above-mentioned epoxy compound to provide excellent coating properties on the organic electronic element. On the other hand, in the case of a surfactant comprising a polar reactive group, it may have high affinity with the other components of the encapsulating composition, and thus realize an excellent effect in terms of adhesion. In an embodiment of the present application, a hydrophilic fluorine-based surfactant or non-silicone-based surfactant may be used to improve inkjet coating properties of a base material.

Specifically, the surfactant may be a polymer type or oligomer type fluorine-based surfactant. As the surfactant, a commercially available product may be used, which may be selected from the group consisting of Glide 100, Glide 110, Glide 130, Glide 460, Glide 440, Glide 450 or RAD 2500 from TEGO, Megaface F-251, F-281, F554, F-560, F-561, F-562, F-563, F-565, F-568, F-570 and F-571 from DIC (DaiNippon Ink Chemicals), or Surflon S-111, S-112, S-113, S-121, S-131, S-132, S-141 and S-145 from Asahi Glass Co., Fluorad FC-93, FC-95, FC-98, FC-129, FC-135, FC-170C, FC-430 and FC-4430 from Sumitomo 3M Ltd., or Zonyl FS-300, FSN, FSN-100 and FSO from DuPont and BYK-350, BYK-354, BYK-355, BYK-356, BYK-358N, BYK-359, BYK-361N, BYK-381, BYK-388, BYK-392, BYK-394, BYK-399, BYK-3440, BYK-3441, BYKETOL-AQ, BYK-DYNWET 800 from BYK, and the like.

The surfactant may be comprised in an amount of 0.01 to 10 parts by weight, 0.05 to 10 parts by weight, 0.1 to 10 parts by weight, 0.5 to 8 parts by weight or 1 to 4 parts by weight, relative to 100 parts by weight of the epoxy compound. Within the content range, the present application makes it possible that the encapsulating composition is applied to an inkjet method to form an organic layer of a thin film.

In an embodiment of the present application, the encapsulating composition may further comprise a photosensitizer in order to complement the curing property at a long wavelength activation energy beam of 300 nm or more. The photosensitizer may be a compound that absorbs a wavelength in a range of 200 nm to 400 nm.

The photosensitizer may be one or more selected from the group consisting of an anthracene-based compound such as anthracene, 9,10-dibutoxyanthracene, 9,10-dimethoxyanthracene, 9,10-diethoxyanthracene and 2-ethyl-9,10-dimethoxyanthracene; a benzophenone-based compound such as benzophenone, 4,4-bis(dimethylamino)benzophenone, 4,4-bis(diethylamino)benzophenone, 2,4,6-trimethylaminobenzophenone, methyl-o-benzolybenzoate, 3,3-dimethyl-4-methoxybenzophenone and 3,3,4,4-tetra(t-butylperoxycarbonyl)benzophenone; a ketone-based compound such as acetophenone, dimethoxyacetophenone, diethoxyacetophenone, 2-hydroxy-2-methyl-1-phenylpropan-1-one and propanone; perylene; a fluorene-based compound such as 9-fluorenone, 2-chloro-9-proprenone and 2-methyl-9-fluorenone; a thioxanthone-based compound such as thioxanthone, 2,4-diethylthioxanthone, 2-chlorothioxanthone, 1-chloro-4-propyloxythioxanthone, isopropylthioxanthone (ITX) and diisopropylthioxanthone; a xanthone-based compound such as xanthone and 2-methylxanthone; an anthraquinone-based compound such as anthraquinone, 2-methylanthraquinone, 2-ethylanthraquinone, t-butylanthraquinone and 2,6-dichloro-9,10-anthraquinone; an acridine-based compound such as 9-phenylacridine, 1,7-bis(9-acridinyl)heptane, 1,5-bis(9-acridinylpentane) and 1,3-bis(9-acridinyl)propane; a dicarbonyl compound such as benzyl, 1,7,7-trimethyl-bicyclo[2,2,1]heptane-2,3-dione and 9,10-phenanthrenequinone; a phosphine oxide-based compound such as 2,4,6-trimethylbenzoyldiphenylphosphine oxide and bis(2,6-dimethoxybenzoyl)-2,4,4-trimethylpentylphosphine oxide; a benzoate-based compound such as methyl-4-(dimethylamino) benzoate, ethyl-4-(dimethylamino) benzoate and 2-n-butoxyethyl-4-(dimethylamino) benzoate; an amino synergist such as 2,5-bis(4-diethylaminobenzal)cyclopentanone, 2,6-bis(4-diethylaminobenzal)cyclohexanone and 2,6-bis(4-diethylaminobenzal)-4-methyl-cyclopentanone; a coumarin-based compound such as 3,3-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H, 11H—Cl]-[6,7,8-ij]-quinolizin-11-one; a chalcone compound such as 4-diethylaminochalcone and 4-azidobenzalacetophenone; 2-benzoylmethylene; and 3-methyl-b-naphthothiazoline.

The photosensitizer may be included in a range of 28 to 40 parts by weight, 31 to 38 parts by weight or 32 to 36 parts by weight, relative to 100 parts by weight of a photoinitiator to be described below. By controlling the content of the photosensitizer, the present invention can realize a synergistic action of curing sensitivity at a desired wavelength, and also prevent the photosensitizer from lowering the adhesive force by not dissolving in the inkjet coating.

In an embodiment of the present application, the encapsulating composition may further comprise a photoinitiator. The photoinitiator may be an ionic photoinitiator. Also, the photoinitiator may be a compound absorbing a wavelength in a range of 200 nm to 400 nm. By using the photoinitiator, the present application can realize excellent curing properties in a specific composition of the present application.

In one example, the photoinitiator may be a cationic photopolymerization initiator. As the cationic photopolymerization initiator, a known material in the art can be used and for example, it may include a compound having a cation moiety comprising aromatic sulfonium, aromatic iodonium, aromatic diazonium or aromatic ammonium and an anion moiety comprising $AsF_6^-$, $SbF_6^-$, $PF^-$, or tetrakis(pentafluorophenyl) borate. Furthermore, as the cationic photopolymerization initiator, an ionized cationic initiator of onium salt or organometallic salt series or a non-ionized cationic photopolymerization initiator of organic silane or latent sulfonic acid series can be exemplified. Diaryliodonium salt, triarylsulfonium salt or aryldiazonium salt and the like can be exemplified as the initiator of the onium salt series, iron arene or the like can be exemplified as the initiator of the organometallic salt series, o-nitrobenzyl triaryl silyl ether, triaryl silyl peroxide or an acyl silane and the like can be exemplified as the initiator of the organosilane series, and ?-sulfonyloxy ketone or α-hydroxymethylbenzoin sulfonate and the like can be exemplified as the initiator of the latent sulfuric acid series, without being limited thereto.

In one example, the encapsulating composition of the present application may comprise a photoinitiator comprising a sulfonium salt as the photoinitiator in the above-mentioned specific composition, so as to be suitable for a use sealing an organic electronic element by an inkjet method. Even if the encapsulating composition according to the above composition is directly sealed on the organic electronic element, it can prevent chemical damage from being applied to the element due to a small amount of generated outgas. Furthermore, the photoinitiator comprising a sulfonium salt may also have excellent solubility, thereby being suitably applied to an inkjet process.

In an embodiment of the present invention, the photoinitiator may be comprised in an amount of 1 to 15 parts by weight, 3 to 14 parts by weight, or 7 to 13.5 parts by weight relative to 100 parts by weight of the epoxy compound. By controlling the photoinitiator content range, the present application can minimize physical and chemical damage of an organic electronic element due to the nature of an organic layer composition that is directly applied to the element.

The encapsulating composition of the present application may further comprise a coupling agent. The present application can improve adhesiveness of a cured product of the encapsulating composition to an adherend or moisture transmission resistance of the cured product. The coupling agent may include, for example, a titanium-based coupling agent, an aluminum-based coupling agent, or a silane coupling agent.

In an embodiment of the present application, the silane coupling agent may include, specifically, an epoxy-based silane coupling agent such as 3-glycidyloxypropyltrimethoxysilane, 3-glycidyloxypropyltriethoxysilane, 3-glycidyloxypropyl (dimethoxy)methylsilane and 2-(3,4-epoxycyclohexyl)ethyltrimethoxysilane; a mercapto-based silane coupling agent such as 3-mercaptopropyltrimethoxysilane, 3-mercaptopropyltriethoxysilane, 3-mercaptopropylmethyldimethoxysilane and 11-mercaptoundecyltrimethoxysilane; an amino-based silane coupling agent such as 3-aminopropyltrimethoxysilane, 3-aminopropyltriethoxysilane, 3-aminopropyldimethoxymethylsilane, N-phenyl-3-aminopropyltrimethoxysilane, N-methylaminopropyltrimethoxysilane, N-(2-aminoethyl)-3-aminopropyltrimethoxysilane and N-(2-aminoethyl)-3-aminopropyldimethoxymethylsilane; a ureide-based silane coupling agent such as 3-ureidepropyltriethoxysilane; a vinyl-based silane coupling agent such as vinyltrimethoxysilane, vinyltriethoxysilane and vinylmethyldiethoxysilane; a styryl-based silane coupling agent such as p-styryltrimethoxysilane; an acrylate-based silane coupling agent such as 3-acryloxypropyltrimethoxysilane and 3-methacryloxypropyltrimethoxysilane; an isocyanate-based silane coupling agent such as 3-isocyanatopropyltrimethoxysilane; a sulfide-based silane coupling agent such as bis(triethoxysilylpropyl)disulfide and bis(triethoxysilylpropyl)tetrasulfide; phenyltrimethoxysilane, methacryloxypropyltrimethoxysilane, imidazolesilane, triazinesilane, and the like.

In the present application, the coupling agent may be included in an amount of 0.1 to 10 parts by weight or 0.5 to 5 parts by weight, relative to 100 parts by weight of the epoxy compound. Within the above range, the present application can realize an effect of improving the adhesiveness by the addition of the coupling agent.

The encapsulating composition of the present application may comprise, if necessary, a moisture adsorbent. The term "moisture adsorbent" can be used to generically mean a component capable of adsorbing or removing moisture or humidity introduced from the outside through a physical or chemical reaction or the like. That is, it means a moisture-reactive adsorbent or a physical adsorbent, and a mixture thereof is also usable.

A specific kind of the usable moisture adsorbent in the present application is not particularly limited, which may include, for example, one or a mixture of two or more of a metal oxide, a metal salt or phosphorus pentoxide ($P_2O_5$), and the like, in the case of a moisture-reactive adsorbent, and may include zeolite, zirconia or montmorillonite, and the like, in the case of the physical adsorbent.

The encapsulating composition of the present application may comprise the moisture adsorbent in an amount of 5 parts by weight to 100 parts by weight, 5 to 80 parts by weight, 5 parts by weight to 70 parts by weight or 10 to 30 parts by weight, relative to 100 parts by weight of the epoxy compound. As the encapsulating composition of the present application preferably controls the content of the moisture adsorbent to 5 parts by weight or more, the present application can make the encapsulating composition or the cured product thereof exhibit excellent moisture and humidity barrier properties. In addition, by controlling the content of the moisture adsorbent to 100 parts by weight or less, the present application can provide a thin film sealing structure.

In one example, the encapsulating composition may further comprise an inorganic filler, if necessary. The specific type of the usable filler in the present application is not particularly limited, and for example, one or a mixture of two or more of clay, talc, alumina, calcium carbonate, silica, and the like may be used.

The encapsulating composition of the present application may comprise 0 to 50 parts by weight, 1 to 40 parts by weight, 1 to 20 parts by weight, or 1 to 10 parts by weight of inorganic filler, relative to 100 parts by weight of the epoxy compound. The present application can provide a sealing structure having excellent moisture or humidity barrier properties and mechanical properties by controlling the inorganic filler, preferably, to 1 part by weight or more. Furthermore, by controlling the content of the inorganic filler to 50 parts by weight or less, the present invention can provide a cured product exhibiting excellent moisture barrier properties even when formed into a thin film.

In addition to the above-mentioned constitutions, the encapsulating composition according to the present application may comprise various additives in the range without affecting the above-described effects of invention. For example, the encapsulating composition may comprise a defoamer, a tackifier, an ultraviolet stabilizer or an antioxidant and the like in an appropriate range of content depending on the desired physical properties.

In one example, the encapsulating composition may be in a liquid phase at room temperature, for example, at about 25° C. In an embodiment of the present application, the encapsulating composition may be in a solventless type liquid phase. The encapsulating composition may be applied to sealing an organic electronic element, and specifically, may be applied to sealing the entire surface of the organic electronic element. As the encapsulating composition has a liquid form at room temperature, the present application can seal the organic electronic element by a method of applying the composition to the side of the element. In addition, the present application has a solventless type, so that the volatile organic compound and/or moisture content can be adjusted to the above-mentioned range.

Also, the encapsulating composition of the present application may be an ink composition. The encapsulating composition of the present application may be an ink composition capable of an inkjet process. The encapsulating composition of the present application may have a specific composition and physical properties so that ink-jetting can be performed.

Furthermore, in an embodiment of the present application, the encapsulating composition may have a viscosity in a range of 50 cPs or less, 1 to 46 cPs or 5 to 44 cPs, as measured by Brookfield's DV-3 at a temperature of 25° C., a torque of 90% and a shear rate of 100 rpm. By controlling the viscosity of the composition within the above range, the present application can realize physical properties that can be performed and increase coating properties, at the time of being applied to an organic electronic element, to provide a sealing material of a thin film.

In one example, the encapsulating composition may have a surface energy of the cured product after curing in a range of 5 mN/m to 45 mN/m, 10 mN/m to 40 mN/m, 15 mN/m to 35 mN/m, or 20 mN/m to 30 mN/m. The surface energy can be measured by a method known in the art, and for example, can be measured by a ring method. The present application can realize excellent coating properties in the above surface energy range.

In an embodiment of the present application, the surface energy ($\gamma^{surface}$, mN/m) can be calculated as $\gamma^{surface} = \gamma^{dispersion} + \gamma^{polar}$. In one example, the surface energy can be measured using a drop shape analyzer (DSA100 product from KRUSS). For example, after an encapsulating composition for measuring the surface energy is applied on a SiNx substrate to a thickness of about 50 µm and a coating area of 4 cm² (width: 2 cm, height: 2 cm) to form a sealing layer (spincoater), it is dried at room temperature for about 10 minutes under a nitrogen atmosphere and then UV-cured with an intensity of 1000 mW/cm² through a light quantity of 4000 mJ/cm². The process of dropping the deionized water whose surface tension is known on the layer after curing, and obtaining the contact angle thereof is repeated five times to obtain an average value of the obtained five contact angle values, and identically, the process of dropping the diiodomethane whose surface tension is known thereon and obtaining the contact angle thereof is repeated five times to obtain an average value of the obtained five contact angle values. Then, the surface energy can be obtained by substituting the value (Strom value) regarding the solvent surface tension by the Owens-Wendt-Rabel-Kaelble method using the obtained average values of the contact angles for the deionized water and diiodomethane.

Also, in an embodiment of the present application, the encapsulating composition may have a light transmittance of 90% or more, 92% or more, or 95% or more in the visible light region after curing. Within the above range, the present application provides an organic electronic device having high-resolution, low power consumption and long-life by applying the encapsulating composition to a top emission type organic electronic device. Furthermore, the encapsulating composition of the present application may have a haze of 3% or less, 2% or less or 1% or less according to JIS K7105 standard test after curing, and the lower limit is not particularly limited, but may be 0%. Within the haze range, the encapsulating composition may have excellent optical properties after curing. In this specification, the above-mentioned light transmittance or haze may be measured in a state where the encapsulating composition is cured to an organic layer, and may be optical characteristics measured when the thickness of the organic layer is any one thickness of 2 µm to 50 µm. In an embodiment of the present application, in order to realize the optical characteristics, the above-mentioned moisture adsorbent or inorganic filler may not be included.

The present application also relates to a method for preparing an encapsulating composition. The preparation method may comprise a moisture removal step. An exemplary preparation method may comprise steps of removing moisture from a solventless encapsulating composition without any photoinitiator; and mixing the photoinitiator with the encapsulating composition. The present application can prevent partial reaction of the photoinitiator and realize the moisture removing effect more excellently by mixing the photoinitiator after the moisture removal step without mixing the photoinitiator in the moisture removal step.

In one example, the moisture removal step may comprise repeatedly heating and cooling the encapsulating composition using a circulator. Also, the moisture removing step is not limited to the above, which may comprise mixing an inert gas with the encapsulating composition. In an embodiment of the present application, the moisture removing step starts nitrogen sparging for the encapsulating composition, raises the temperature to any one of 50° C. to 100° C. or 73° C. to 88° C. through a circulator and continues for 1 hour to 5 hours or 90 minutes to 5 hours. Then, the circulator is cooled to a temperature of 20° C. to 50° C. or 23° C. to 33° C. In the present application, the step may be performed one or more times and may be repeated 10 times or less, but is not limited thereto.

In addition, the moisture removal step is not limited to the above, which may also be performed by a method of passing the moisture adsorbent over the encapsulating composition. The passing method is not particularly limited, which may comprise a step of bringing the encapsulating composition into contact with the moisture adsorbent.

In one example, the moisture removal step may proceed with the pressure maintained. That is, the moisture removal step may proceed at a constant pressure, where the maintaining the pressure (constant pressure) may have an error range of −0.5 to 0.5 atm or −0.3 to 0.3 atm. The moisture removal step may proceed in a state constantly maintained at any one pressure of 0.5 to 2 atm, 0.8 to 1.8, 0.9 to 1.5, or 1.0 to 1.3 atm. In addition, the moisture removal step may comprise no distillation purification process. By controlling the conditions during the moisture removal step, due to the nature of an encapsulating composition of the present application that is applied to an organic electronic element as an ink composition, the present application prevents the reliability from being degraded by progressing partial curing and prevents outgas generated in an organic layer after final curing, thereby realizing endurance reliability of the organic electronic element.

The present application also relates to an organic electronic device. As shown in FIG. 1, an exemplary organic electronic device (3) may comprise a substrate (31); an organic electronic element (32) formed on the substrate (31); and an organic layer (33) sealing the entire surface of the organic electronic element (32) and comprising the above-described encapsulating composition.

In an embodiment of the present application, the organic electronic element may comprise a first electrode layer, an organic layer formed on the first electrode layer and comprising at least a light emitting layer, and a second electrode layer formed on the organic layer. The first electrode layer may be a transparent electrode layer or a reflective electrode layer, and the second electrode layer may also be a transparent electrode layer or a reflective electrode layer. More specifically, the organic electronic element may comprise a reflective electrode layer formed on a substrate, an organic layer formed on the reflective electrode layer and comprising at least a light emitting layer, and a transparent electrode layer formed on the organic layer.

In the present application, the organic electronic element (23) may be an organic light emitting diode.

In one example, the organic electronic device according to the present application may be a top emission type, but is not limited thereto, and may be applied to a bottom emission type.

The organic electronic device may further comprise a protective layer (35) for protecting the electrodes and the light emitting layer of the element. The protective layer may be an inorganic protective layer (35). The protective layer may be a protective layer by chemical vapor deposition (CVD), and as the material, a known inorganic material may be used, and for example, silicon nitride (SiNx) may be used. In one example, silicon nitride (SiNx) used as the protective layer can be deposited to a thickness of 0.01 µm to 50 µm.

In an embodiment of the present application, the organic electronic device (3) may further comprise an inorganic layer (34) formed on the organic layer (33). The material of the inorganic layer (34) is not limited, which may be the same as or different from the above-described protective layer. In one example, the inorganic layer may be one or more metal oxides or nitrides selected from the group consisting of Al, Zr, Ti, Hf, Ta, In, Sn, Zn and Si. The inorganic layer may have a thickness of 0.01 μm to 50 μm or 0.1 μm to 20 μm or 1 μm to 10 μm. In one example, the inorganic layer of the present application may be an inorganic material without any dopant, or may be an inorganic material containing a dopant. The dopant which may be doped may be one or more elements selected from the group consisting of Ga, Si, Ge, Al, Sn, Ge, B, In, Ti, Sc, V, Cr, Mn, Fe, Co and Ni, or an oxide of the element, but is not limited thereto.

In one example, the organic layer may have a thickness in a range of 2 μm to 20 μm, 2.5 μm to 15 μm, and 2.8 μm to 9 μm. The present application may provide a thin-film organic electronic device by providing a thin organic layer.

The organic electronic device (3) of the present application may comprise a sealing structure comprising the organic layer (33) and the inorganic layer (34), as described above, where the sealing structure may comprise at least one or more organic layers and at least one or more inorganic layers, and the organic layer and the inorganic layer may be repeatedly laminated. For example, the organic electronic device may have a structure of substrate/organic electronic element/protective layer/(organic layer/inorganic layer)n, where n may be a number in a range of 1 to 100. FIG. 1 is a cross-sectional view exemplarily showing a case where n is 1.

In one example, the organic electronic device (3) of the present application may further comprise a cover substrate present on the organic layer (33). The material of the substrate and/or the cover substrate is not particularly limited, and a known material in the art may be used. For example, the substrate or the cover substrate may be glass, a metal base material or a polymer film. As the polymer film, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film and the like may be used.

Also, as shown in FIG. 2, the organic electronic device (3) may further comprise a encapsulation film (37) existing between the cover substrate (38) and the substrate (31) on which the organic electronic element (32) is formed. The encapsulation film (37) may be applied as a use for attaching the substrate (31) on which the organic electronic element (32) is formed and the cover substrate (38), which may be, for example, a pressure-sensitive adhesive film or an adhesive film, but is not limited thereto. The encapsulation film (37) may seal the entire surface of the sealing structure (36) of the above-described organic layer and inorganic layer, laminated on the organic electronic element (32).

The present application also relates to a method for manufacturing an organic electronic device.

In one example, the manufacturing method may comprise a step of forming an organic layer (33) on a substrate (31) in which an organic electronic element (32) is formed on its upper part, so that the above-described encapsulating composition seals the entire surface of the organic electronic element (32).

Here, the organic electronic element (32) may be produced by forming a reflective electrode or a transparent electrode on a substrate (31) such as glass or a polymer film, as a substrate (31), by a method such as vacuum deposition or sputtering, and forming an organic material layer on the reflective electrode. The organic material layer may comprise a hole injecting layer, a hole transporting layer, a light emitting layer, an electron injecting layer, and/or an electron transporting layer. Subsequently, a second electrode is further formed on the organic material layer. The second electrode may be a transparent electrode or a reflective electrode.

The manufacturing method of the present application may further comprise a step of forming a protective layer (35) on the first electrode, the organic material layer and the second electrode, formed on the substrate (31). Then, the above-described organic layer (33) is applied to cover the entire surface of the organic electronic element (32) on the substrate (31). Here, the step of forming the organic layer (33) is not particularly limited and the above-described encapsulating composition may be applied to the entire surface of the substrate (31) using a process such as inkjet printing, gravure coating, spin coating, screen printing or reverse offset coating.

The manufacturing method may further comprise a step of irradiating the organic layer with light. In the present invention, a curing process may also be performed on an organic layer sealing an organic electronic device, and such a curing process may be performed, for example, in a heating chamber or a UV chamber, and preferably, may be performed in a UV chamber.

In one example, after the above-described encapsulating composition is applied to form a entire surface organic layer, the composition can be irradiated with light to induce cross-linking. The irradiation of light may comprise irradiating with light having a wavelength range of 250 nm to 450 nm or 300 nm to 450 nm region bands at a light quantity of 0.3 to 6 J/cm$^2$ or a light quantity of 0.5 to 5 J/cm$^2$.

In addition, the manufacturing method of the present application may further comprise a step of forming an inorganic layer (34) on the organic layer (33). As the step of forming an inorganic layer, a known method in the art may be used, which may be the same as or different from the above-described method of forming a protective layer.

Advantageous Effects

The present application provides an encapsulating composition which can effectively block moisture or oxygen introduced into an organic electronic device from the outside to secure the lifetime of the organic electronic device, is possible to realize a top emission type organic electronic device, is applicable to an inkjet method, can provide a thin display and can control moisture content to prevent damage to the element, a method for preparing the same and an organic electronic device comprising the same.

BRIEF DESCRIPTION OF DRAWINGS

FIGS. 1 and 2 are cross-sectional views showing an organic electronic device according to one example of the present invention.

EXPLANATION OF REFERENCE NUMERALS

3: organic electronic device
31: substrate

32: organic electronic element
33: organic layer
34: inorganic layer
35: protective layer
36: sealing structure
37: encapsulation film
38: cover substrate

BEST MODE

Hereinafter, the present invention will be described in more detail through Examples according to the present invention and Comparative Examples not complying with the present invention, but the scope of the present invention is not limited by the following examples.

Example 1

An alicyclic epoxy compound (Celloxide 2021P, Daicel Corp.) and an aliphatic epoxy compound (DE203, HAJIN CHEM TECH) as epoxy compounds, an oxetane group-containing compound (OXT-221 from TOAGOSEI) and a fluorine-based surfactant (F552 from DIC) were each introduced into a mixing vessel in a weight ratio of 23.8:28.7:37.5:1.0 (Celloxide2021P:DE203:OXT-221:F552) at room temperature.

In the mixing vessel, a uniform encapsulating composition ink was prepared using a planetary mixer (Kurabo, KK-250s).

The composition ink is subjected to a moisture removal step. In the mixing vessel, nitrogen sparging is started for the prepared encapsulating composition, and the temperature is raised to 85° C. through a circulator to continue the sparging for 3 hours. Thereafter, the circulator is cooled to room temperature.

To the encapsulating composition, a photoinitiator (I290) was mixed at a ratio of 5 parts by weight to prepare a uniform encapsulating composition ink.

Example 2

An encapsulating composition was prepared in the same manner as in Example 1, except that in the mixing vessel, the nitrogen sparging was started for the prepared encapsulating composition and the temperature was raised to 85° C. through a circulator to continue the sparging for 1 hour.

Example 3

An alicyclic epoxy compound (Celloxide 2021P, Daicel Corp.) and an aliphatic epoxy compound (DE203, HAJIN CHEM TECH) as epoxy compounds, an oxetane group-containing compound (OXT-221 from TOAGOSEI) and a fluorine-based surfactant (F552 from DIC) were each introduced into a mixing vessel in a weight ratio of 23.8:28.7:37.5:1.0 (Celloxide2021P:DE203:OXT-221:F552) at room temperature.

In the mixing vessel, a uniform encapsulating composition ink was prepared using a planetary mixer (Kurabo, KK-250s).

The composition ink is subjected to a moisture removal step. In the mixing vessel, the prepared encapsulating composition is heated and dried under a reduced pressure condition.

Thereafter, to the encapsulating composition, a photoinitiator (I290) was mixed at a ratio of 5 parts by weight to prepare a uniform encapsulating composition ink.

Example 4

An encapsulating composition was prepared in the same manner as in Example 3, except that in the moisture removal step, it was distilled and purified under a reduced pressure condition.

Comparative Example 1

An encapsulating composition was prepared in the same manner as in Example 1, except that no moisture removal step was performed.

Comparative Example 2

An alicyclic epoxy compound (Celloxide 2021P, Daicel Corp.) and an aliphatic epoxy compound (DE203, HAJIN CHEM TECH) as epoxy compounds, an oxetane group-containing compound (OXT-221 from TOAGOSEI), a photoinitiator (I290) and a fluorine-based surfactant (F552 from DIC) were each introduced into a mixing vessel in a weight ratio of 23.8:28.7:37.5:5.0:1.0 (Celloxide2021P:DE203:OXT-221:I290:F552) at room temperature.

In the mixing vessel, a uniform encapsulating composition ink was prepared using a planetary mixer (Kurabo, KK-250s).

The composition ink is subjected to a moisture removal step. In the mixing vessel, nitrogen sparging is started for the prepared encapsulating composition, and the temperature is raised to 85° C. through a circulator to continue the sparging for 3 hours. Thereafter, the circulator is cooled to room temperature.

Comparative Example 3

An alicyclic epoxy compound (Celloxide 2021P, Daicel Corp.) and an aliphatic epoxy compound (DE203, HAJIN CHEM TECH) as epoxy compounds, an oxetane group-containing compound (OXT-221 from TOAGOSEI) and a fluorine-based surfactant (F552 from DIC) were each introduced into a mixing vessel in a weight ratio of 23.8:28.7:37.5:1.0 (Celloxide2021P:DE203:OXT-221:F552) at room temperature, and the mixture was diluted with 2-butoxy-ethanol as a solvent so that the epoxy compounds were about 90% by weight to prepare a coating solution.

In the mixing vessel, a uniform encapsulating composition ink was prepared using a planetary mixer (Kurabo, KK-250s).

The composition ink is subjected to a moisture removal step. In the mixing vessel, nitrogen sparging is started for the prepared encapsulating composition, and the temperature is raised to 85° C. through a circulator to continue the sparging for 3 hours. Thereafter, the circulator is cooled to room temperature.

To the encapsulating composition, a photoinitiator (I290) was mixed at a ratio of 5 parts by weight to prepare a uniform encapsulating composition ink.

Comparative Example 4

An encapsulating composition was prepared in the same manner as in Comparative Example 3, except that no moisture removal step was performed.

Physical properties in Examples and Comparative Examples were evaluated in the following manner.

1. Moisture Content Measurement

The moisture content of the encapsulating compositions prepared in Examples and Comparative Examples was measured by using Karl Fischer titrators-831 KF Coulometer-coulometric from Metrohm. The moisture content was measured using Karl Fischer coulometric titration for 100 mg of the composition. Also, the measurement was performed at a temperature of 25° C., performed in an airtight container and adjusted to an equivalent point of 50 mV within an appropriate speed range of 0.3 to 2240 μg/min.

2. Outgas Measurement

The encapsulating compositions prepared in Examples and Comparative Examples were each cured by irradiation with UV of 1 J/cm$^2$ at an intensity of 1000 mW/cm$^2$, and 50 mg of each sample of the cured products was maintained at 110° C. for 30 minutes using Purge & Trap-gas chromatography/mass spectrometry and then the amount of volatile organic compounds was measured. The measurement was performed using a Purge & Trap sampler (JAI JTD-505 III)-GC/MS (Agilent 7890b/5977a) instrument. It was represented as O in the case where the measured amount was 100 ppm or less, as Δ in the case where it was 500 ppm or less and as X in the case where it was more than 500 ppm.

4. Dark Spot Measurement

The encapsulating compositions prepared in Examples and Comparative Examples were each applied on an organic electronic element on which an inorganic vapor deposition layer (chemical vapor deposition layer) was formed. Thereafter, it was irradiated with UV of 1 J/cm$^2$ at an intensity of 1000 mW/cm$^2$ to be subjected to curing. The cured organic layer was allowed to stand at a temperature of 85° C. and an environment of 85% R.H. for 300 hours, and then the emission type was observed. It was classified as O in the case of no dark spot by foreign materials, as Δ in the case where 1 to 2 dark spots were observed and as X in the case where 3 or more dark spots were much generated and thus light emitting was impossible.

TABLE 1

| | Moisture content (ppm) | Outgas | Dark spot |
|---|---|---|---|
| Example 1 | 98 | O | O |
| Example 2 | 532 | O | Δ |
| Example 3 | 120 | Δ | Δ |
| Example 4 | 210 | Δ | Δ |
| Comparative Example 1 | 1004 | O | X |
| Comparative Example 2 | not measurable | not measurable | not measurable |
| Comparative Example 3 | 669 | X | X |
| Comparative Example 4 | 1512 | X | X |

In Comparative Example 2, partial curing progressed during the heating and cooling, and the experiment was not carried out.

The invention claimed is:

1. An encapsulating composition for encapsulating an organic electronic device (OED) comprising:
   an epoxy compound, and
   a compound having an oxetane group in a range of 45 parts by weight to 145 parts by weight relative to 100 parts by weight of the epoxy compound,
   wherein the compound having an oxetane group has a weight average molecular weight in a range of 150 to 1,000 g/mol and a boiling point in a range of 90 to 270° C.,
   wherein the encapsulating composition is a solventless composition and a composition configured for inkjet process,
   wherein the encapsulating composition has a viscosity in a range of 1 to 46 cPs as measured by Brookfield's DV-3 at a temperature of 25° C., a torque of 90% and a shear rate of 100 rpm, and
   wherein the composition has a moisture content of 1000 ppm or less according to a Karl Fischer coultometric titration method for 100 mg of the composition.

2. The encapsulating composition according to claim 1, wherein after curing, the amount of volatile organic compounds measured after maintaining 50 mg of the cured product at 110° C. for 30 minutes using Purge & Trap-gas chromatography/mass spectrometry, is less than 100 ppm.

3. The encapsulating composition according to claim 1, wherein the epoxy compound has at least bifunctionality or more.

4. The encapsulating composition according to claim 1, wherein the epoxy compound comprises a compound having a cyclic structure in its molecular structure and/or a linear or branched aliphatic compound.

5. The encapsulating composition according to claim 4, wherein the compound having a cyclic structure in its molecular structure has ring constituent atoms in the molecular structure in a range of 3 to 10.

6. The encapsulating composition according to claim 4, wherein the linear or branched aliphatic compound is comprised in a range of 20 parts by weight or more and less than 205 parts by weight relative to 100 parts by weight of the compound having a cyclic structure.

7. The encapsulating composition according to claim 1, further comprising a surfactant.

8. The encapsulating composition according to claim 7, wherein the surfactant comprises a polar functional group.

9. The encapsulating composition according to claim 7, wherein the surfactant comprises a fluorine-based compound.

10. The encapsulating composition according to claim 7, wherein the surfactant is comprised in an amount of 0.01 parts by weight to 10 parts by weight relative to 100 parts by weight of the epoxy compound.

11. The encapsulating composition according to claim 1, further comprising a photoinitiator.

12. The encapsulating composition according to claim 11, wherein the photoinitiator is comprised in an amount of 1 to 15 parts by weight relative to 100 parts by weight of the epoxy compound.

13. A method for preparing the encapsulating composition of claim 1, comprising steps of:
   removing moisture from a solventless encapsulating composition without any photoinitiator; and
   mixing a photoinitiator with the encapsulating composition.

14. The method according to claim 13, wherein the moisture removal step comprises heating and cooling the encapsulating composition or mixing an inert gas therewith.

15. The method according to claim 13, wherein the moisture removal step proceeds at a constant pressure.

16. The method according to claim 15, wherein the moisture removal step proceeds in a state where the pressure is constantly maintained at any one pressure of 0.5 to 2 atm.

17. The method according to claim 15, wherein the constant pressure has an error range of −0.5 to 0.5 atm.

18. An organic electronic device comprising a substrate; an organic electronic element formed on the substrate; and an organic layer sealing the entire surface of the organic electronic element and comprising the encapsulating composition according to claim 1.

19. A method for manufacturing an organic electronic device comprising a step of forming an organic layer on a substrate in which an organic electronic element is formed on its upper part, so that the encapsulating composition of claim 1 seals the entire surface of the organic electronic element.

\* \* \* \* \*